United States Patent [19]

Shirahata et al.

[11] Patent Number: 4,946,921
[45] Date of Patent: Aug. 7, 1990

[54] ALKALI-SOLUBLE ORGANOPOLYSILOXANE

[75] Inventors: Akihiko Shirahata; Yoshimi Fukutani, both of Chiba, Japan

[73] Assignee: Toray Silicone Company Limited, Tokyo, Japan

[21] Appl. No.: 350,371

[22] Filed: May 11, 1989

[30] Foreign Application Priority Data

May 18, 1988 [JP] Japan ................... 63-121426

[51] Int. Cl.$^5$ .............................................. C08G 77/00
[52] U.S. Cl. ......................................... 528/39; 528/12;
528/43; 556/453; 556/455
[58] Field of Search .................. 528/12, 39, 43;
556/453, 455

[56] References Cited

U.S. PATENT DOCUMENTS 4,745,169  5/1988  Sugiyama et al. ............... 528/43
4,855,381  8/1989  Mutoh et al. ..................... 528/39

FOREIGN PATENT DOCUMENTS 256347  2/1986  Japan.
96526   5/1987  Japan.
104032  5/1987  Japan.

Primary Examiner—Melvyn I. Marquis
Attorney, Agent, or Firm—Roger H. Borrousch

[57] ABSTRACT

Alkali-soluble organopolysiloxanes useful in the alkali-developing resist materials for use in microprocesses in LSI device fabrication have the following general formula

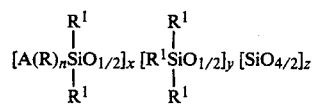

where A is a hydroxyphenyl group; R is an alkylene group having 1 to 4 carbon atoms; n is zero or one; $R^1$ is an alkyl group having 1 to 4 carbon atoms; x and z are positive numbers; y is zero or a positive number; x, y, and z have values such that their ratios are $0.3 \leq (x+y)/z \leq 4$; and $zero \leq y/x \leq 5$.

8 Claims, No Drawings

ALKALI-SOLUBLE ORGANOPOLYSILOXANE

BACKGROUND OF THE INVENTION

1. Technical Field

The present invention relates to a novel alkali-soluble organopolysiloxane.

2. Prior Art

Alkali-soluble organopolysiloxanes are already known in the form of the straight-chain, phenol-functional organopolysiloxane described in Japanese Patent Application Laid Open (Kokai or Unexamined) No. 61-256347 (256,347/86) and the polyorganosilsequioxane described in Japanese Patent Application Laid Open No. 62-96526 (96,526/87), both applications are the basis of U.S. Pat. No. 4,745,169, issued May 17, 1988, to Sugiyama et al. In Japanese Patent Application Laid Open (Kokai) No. Sho 62-104,032 (104,032/87) to Hitachi KK, a diorganopolysiloxane having hydroxyphenylalkylene groups side chains and a hydroxyphenylalkyl polysilsesquioxane are known to be useful in alkali development-type organic silicon resist composed of alkali soluble siloxane polymer and a light or radiation sensitive dissolution inhibitor.

PROBLEM TO BE SOLVED BY THE INVENTION

However, alkali-soluble organopolysiloxane having both the tetrafunctional siloxane unit and a hydroxyphenyl group-containing monofunctional triorganosiloxane unit in one and the same molecule has not been described up to now.

The present invention takes as its object the introduction of a novel alkali-soluble organopolysiloxane not heretofore described in the literature.

SUMMARY OF THE INVENTION

The aforesaid object is achieved by means of an alkali-soluble organopolysiloxane with a molecular weight of 500 to 500,000 and having the following general formula

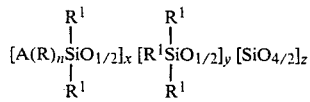

in the formula, A is a hydroxyphenyl group; R is an alkylene group having 1 to 4 carbon atoms; n is zero or one; $R^1$ is an alkyl group having 1 to 4 carbon atoms; x and z are positive numbers; y is zero or a positive number; x, y, and z have values such that their ratios are $0.3 \leq (x+y)/z \leq 4$; and zero $\leq y/x \leq 5$.

DETAILED DESCRIPTION OF THE PREFERRED EMBODIMENTS

To explain the preceding in greater detail, A in the above formula is the hydroxyphenyl group, and examples are the ortho-hydroxyphenyl group, the meta-hydroxyphenyl group, the para-hydroxyphenyl group, the 2,3-dihydroxyphenyl group, the 2,4-dihydroxyphenyl group, the 3,4-dihydroxyphenyl group, and the 3,5-dihydroxyphenyl group. Within the individual molecule, the group A may comprise only a single species, or it may comprise a combination of two or more different species. The group R comprises alkylene groups having 1 to 4 carbon atoms, and examples are methylene, ethylene, n-propylene, isopropylene, n-butylene, and isobutylene. Finally, n is zero or one.

$R^1$ is an alkyl group having 1 to 4 carbon atoms. Examples are methyl, ethyl, n-propyl, isopropyl, n-butyl, and isobutyl. Again, within the individual molecule $R^1$ may comprise only a single species, or may comprise a combination of two or more different species.

Furthermore, x and z are positive numbers, y is zero or a positive number, and it is necessary that $0.3 \leq (x+y)/z \leq 4$ and that zero $\leq y/x \leq 5$. When x, y, and z fall outside these ranges, synthesis becomes difficult and alkali solubility is not obtained. Furthermore, when x, y, and z satisfy $0.4 \leq (x+y)/z \leq 1.2$ and zero $\leq y/x \leq 5$, the organopolysiloxane of the present invention will be a solid at room temperature.

The molecular weight is to be 500 to 500,000 because synthesis is difficult outside this range.

Any of the following may be bonded to the tetrafunctional siloxane unit with the formula

in the organopolysiloxane of the present invention: other tetrafunctional siloxane units with the formula

monofunctional siloxane units with the following general formula

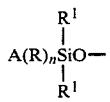

A, R, $R^1$, and n in the formula are defined as above, and monofunctional siloxane units with the following general formula

$R^1$ is defined as above. In addition, the organopolysiloxane of the present invention may also contain minor quantities of hydroxyl groups, alkoxy groups, and halogen atoms, etc., as residues from the synthesis process.

The alkali-soluble organopolysiloxane of the present invention can be prepared by the cohydrolysis and condensation reactions of x moles of a hydrolyzable group-containing organosilane with the following general formula

(1)

in formula (1), A, R, $R^1$, and n are defined as above, and M is a hydrolyzable group, y moles of a hydrolyzable group-containing organosilane with the following general formula

$R^1$ and M are defined as above, and z moles of a hydrolyzable silane with the following general formula

M in the formula is defined as above, wherein x, y, and z are defined as above. Synthesis may also be carried out by analogous cohydrolysis and condensation reactions, but replacing the organosilane with formula (1) with the corresponding compound in which the hydroxyl group of the hydroxyphenyl moiety is protected by an alkyl group such as methyl, ethoxyethyl, or t-butyl; an acyl group such as acetyl; or a trialkylsilyl group such as trimethylsilyl or t-butyldimethylsilyl and the hydrolyzable group-containing organosilane has the following general formula

in the formula, A, R, $R^1$, and n are defined as above, and M is a hydrolyzable group. Furthermore, in the case of protection with a trialkylsilyl group, this trialkylsilyl group undergoes hydrolysis and is introduced into the organopolysiloxane of the present invention in the form of the monofunctional siloxane unit with the general formula

$R^1$ is defined as above.

Examples of the hydrolyzable group M in the above formulas are halogen atoms such as the chlorine atom and bromine atom; alkoxy groups such as methoxy, ethoxy, isopropoxy, and methoxyethoxy; and acyloxy groups such as acetoxy.

Solvent may be used during cohydrolysis, such as aromatic hydrocarbon solvents such as benzene, toluene, and xylene; alcohol solvents such as methanol and ethanol; ketone solvents such as acetone; and chlorinated hydrocarbon solvents. Furthermore, an acid or alkali catalyst may be used in order to promote the cohydrolysis and condensation reactions. Examples of the former are hydrochloric acid, sulfuric acid, phosphoric acid, nitric acid, and acetic acid, and examples of the latter are sodium hydroxide, potassium hydroxide, lithium hydroxide, ammonia, and amines.

Merely by varying the molar ratio between the monofunctional siloxane units and tetrafunctional siloxane units, it is possible freely to adjust various properties of the organopolysiloxane of the present invention, for example, the molecular weight, softening point, quantity of hydroxyphenyl group, alkali solubility, etc. The organopolysiloxane of the present invention is soluble in aqueous alkali solutions such as aqueous sodium hydroxide and aqueous tetramethylammonium hydroxide, and is also soluble in various organic solvents such as hydrocarbon solvents, aromatic hydrocarbon solvents, chlorinated hydrocarbon solvents, alcohol solvents, ether solvents, amide solvents, ketone solvents, ester solvents, and Cellosolve solvents. Accordingly, one can contemplate practical application in, inter alia, alkali-developing resist materials for use in microprocesses in LSI device fabrication.

The following examples are presented for illustrative purposes and should not be construed as limiting the invention which is properly delineated in the claims. The present invention is further explained by means of the following examples, in which Me=methyl.

REFERENCE EXAMPLE 1

(1) Synthesis of m-isopropenylphenyl trimethylsilyl ether 134.2 g (1.0 mol) m-isopropenylphenol was placed in a four-neck flask equipped with a stirrer, reflux condenser, addition funnel, and thermometer. While stirring and heating at 70 degrees Centigrade, 96.8 g (0.6 mol) hexamethyldisilazane was dripped in from the addition funnel, and ammonia was simultaneously evolved. After the completion of the addition, the reaction was additionally stirred for approximately 2 hours at 70 degrees Centigrade. Distillation in vacuo afforded 202 g (0.98 mol) of the target material. The yield was 98%. The properties of the product, as reported below, confirmed it to be m-isopropenylphenyl trimethylsilyl ether.

boiling point: 85 degrees Centigrade/4 mmHg.

NMR delta (ppm): 0.61 (s, 9H), 2.44 (s, 3H), 5.21 (m, 1H), 5.54 (m, 1H), 6.8 to 7.8 (m, 4H).

(2) Synthesis of 1-(chlorodimethylsilyl)-2-(m-trimethylsiloxyphenyl)-propane

The following were added to a four-neck flask equipped with a stirrer, reflux condenser, addition funnel, and thermometer: 165 g (0.8 mol) m-isopropenylphenyl trimethylsilyl ether from step (1), 0.2 g 4-methoxyphenol, and 100 ppm as platinum of 2 weight % isopropanolic chloroplatinic acid solution. While stirring and heating at 50 to 60 degrees Centigrade, 83.5 g (0.88 mol) dimethylchlorosilane was dripped in from the addition funnel over 5 hours. After the completion of the reaction, distillation in vacuo afforded 202 g (0.67 mol) of the target material. The yield was 84%. Some properties of this product are reported below.

boiling point: 115 degrees Centigrade/2 mmHg.

NMR delta (ppm): 0.25 (s, 3H), 0.27 (s, 3H), 0.61 (s, 9H), 1.1 to 1.5 (m, 5H), 2.8 to 3.2 (m, 1H), 6.5 to 7.3 (m, 4H).

EXAMPLE 1

The following were charged to a four-neck flask equipped with a stirrer, reflux condenser, addition funnel, and thermometer: 120.4 g (0.4 mol) of the 1-(chlorodimethylsilyl)-2-(m-trimethylsiloxyphenyl)propane obtained in step (2) of Reference Example 1, 208.3 g (1.0 mol) tetraethoxysilane, and 100 g toluene. While stirring and heating at 70 degrees Centigrade, a mixture of 60 g water, 40 g concentrated hydrochloric acid, and 20 g ethanol was dripped in over approximately 1 hour.

After the completion of addition, heating under reflux at 75 degrees Centigrade was continued for 4 hours. 250 g water was then added, and 2 layers separated upon standing. The lower, polymer layer was taken off, and the upper layer was extracted with 200 g toluene. The polymer and toluene layers were then combined. This was placed in a flask equipped with a graduated water separator, and the water and ethanol were azeotropically distilled out. 0.10 g potassium hydroxide was added, and dehydration was continued for 4 hours and the residual silanol was condensed. Cooling, neutralization of the potassium hydroxide with trimethylchlorosilane, filtration, and concentration, provided 147 g of an organopolysiloxane according to the present invention (yield=85%).

The properties of this product, as reported below, confirmed it to be an organopolysiloxane with the following structure

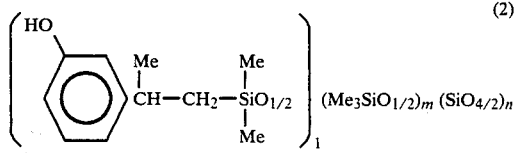

in the formula, $l:m:n = 0.4:0.4:1$.

molecular weights (GPC, chloroform solvent, calibrated with polystyrene standard):
$\overline{M}_w$ (weight-average molecular weight)$=1.3 \times 10^3$
$\overline{M}_n$ (number-average molecular weight)$=1.1 \times 10^3$
softening point: 80 to 85 degrees Centigrade.
$^1$HNMR delta (ppm): $-0.4$ to 0.4 (br, 15H), 0.7 to 1.4 (br, 6H), 2.5 to 3.1 (br, 6H), 6.2 to 7.2 (br, 4H).
$^{29}$SiNMR delta (ppm): $-115$ to $-103$ (br, 0.93Si), $-103$ to $-98$ (br, 0.07Si), 9 to 16 (br, 0.63Si).
$^{13}$CNMR delta (ppm): 1 (s,4.5C), 25 (s, 1C), 28 (s, 1C), 36 (s, 1C), 114 (s, 1C), 119 (m, 2C), 129 (s, 1C), 149 to 157 (m, 2C).
IR n (cm$^{-1}$): 3450 (br), 2970, 2900, 1600, 1490, 1450, 1250, 1080 (br), 840, 760, 700.

Organopolysiloxane polymers according to the present invention were similarly obtained by charging the 1-(chlorodimethylsilyl)-2-(m-trimethylsiloxyphenyl)-propane obtained in step (2) of Reference Example 1, tetraethoxysilane, and trimethylchlorosilane to the reaction at the proportions given in Table 1. In Table 1, x represents moles of 1-(chlorodimethylsilyl-2-(m-trimethylsiloxyphenyl)propane; y represents moles of trimethylchlorosilane; and z represents moles of tetraethoxysilane. Some properties of the products are also reported in Table 1.

TABLE 1

| MOLAR RATIO OF CHARGE | | | | SOFTENING | l:m:n |
|---|---|---|---|---|---|
| x | y | z | $M_w$ | POINT, °C. | in Formula (2) |
| 0.40:0:1 | | | $1.3 \times 10^3$ | 80 to 85 | 0.4:0.4:1 |
| 0.35:0:1 | | | $3.4 \times 10^3$ | 190 to 200 | 0.35:0.35:1 |
| 0.30:0.20:1 | | | $1.2 \times 10^3$ | 75 to 80 | 0.3:0.5:1 |

The products were soluble in organic solvents such as methanol, ethanol, tetrahydrofuran, toluene, dimethylformamide, methyl isobutyl ketone, isoamyl acetate, hexane, and carbon tetrachloride, and were also soluble in aqueous sodium hydroxide and aqueous tetramethylammonium hydroxide.

REFERENCE EXAMPLE 2

(1) Synthesis of m-acetoxyisopropenylbenzene 250 g (1.86 mol) m-isopropenylphenol and 15 mL (0.19 mol) pyridine were placed in a four-neck flask equipped with a stirrer, reflux condenser, addition funnel, and thermometer. While stirring with cooling on a water bath, 200 mL (2.12 mol) acetic anhydride was dripped in. The reaction mixture was then diluted with ether and washed with water to neutrality. Drying and distillation afforded 310 g (1.76 mol) of the target material. The yield was 94%. The properties of this product are reported below.

boiling point: 100 degrees Centigrade/4 mmHg.
NMR delta (ppm): 1.97 (s, 3H), 2.00 (s, 3H), 4.90 (m, 1H), 5.19 (m, 1H), 6.65 to 7.15 (m, 4H).

(2) Synthesis of 1-(chlorodimethylsilyl)-2-(m-acetoxyphenyl)propane

The following were charged to a four-neck flask equipped with a stirrer, reflux condenser, addition funnel, and thermometer: 100 g (0.57 mol) m-acetoxyisopropenylbenzene as prepared in step (1) of Reference Example 2, sufficient 2 weight % isopropanolic chloroplatinic acid solution to give approximately 100 ppm as platinum, and 0.2 g 4-methoxyphenol. While stirring and heating at 80 degrees Centigrade, 70 g (0.74 mol) dimethylchlorosilane was dripped in from the addition funnel. After completion of the reaction, distillation in vacuo afforded 115 g (0.42 mol) of the target material. The yield was 75%. The properties of this product are reported below.

boiling point: 113 degrees Centigrade/2 mmHg.
NMR delta (ppm): 0.14 (s, 6H), 1.16 (s, 2H), 1.26 (s, 3H), 2.12 (s, 3H), 2.65 to 3.30 (m, 1H), 6.55 to 7.30 (m, 4H).

EXAMPLE 2

The following were charged to a four-neck flask equipped with a stirrer, reflux condenser, addition funnel, and thermometer: 67.7 g (0.25 mol) of the 1-(chlorodimethylsilyl)-2-(m-acetoxyphenyl)propane as prepared in step (2) of Reference Example 2, 104.2 g (0.5 mol) tetraethoxysilane, and 50 g toluene. While stirring and heating at 70 degrees Centigrade, a mixture of 30 g water, 20 g concentrated hydrochloric acid, and 10 g ethanol was dripped in over approximately 1 hour. Separation, dehydration, and condensation were carried out as in Example 1 to afford 77.5 g of an organopolysiloxane according to the present invention. The yield was 96%. The properties of this product, as reported below, confirmed it to be an organopolysiloxane with the following structure.

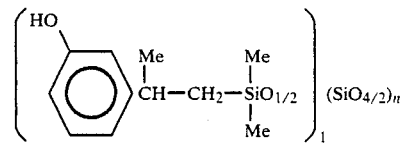

in the formula, $l:n=0.5:1$.
softening point: 150 to 160 degrees Centigrade.
$^1$HNMR delta (ppm): $-1.0$ to 0.0 (br, 6H), 0.0 to 1.2 (br, 5H), 2.0 to 2.9 (br, 1H), 5.9 to 6.8 (br, 4H).
$^{29}$SiNMR delta (ppm): $-115$ to $-105$ (br, 0.90Si), $-105$ to $-95$ (br, 0.10Si), 10 to 20 (br, 0.59Si).
molecular weights:
$\overline{M}_w = 5.6 \times 10^3$
$\overline{M}_n = 3.2 \times 10^3$ This product was soluble in methanol, tetrahydrofuran, dimethylformamide, methyl isobutyl ketone, and isoamyl acetate, but was poorly soluble in hexane, carbon tetrachloride, chloroform, toluene, etc. It was also soluble in aqueous sodium hydroxide and aqueous tetramethylammonium hydroxide.

REFERENCE EXAMPLE 3

Synthesis of 1-(chlorodimethylsilyl)-2-(p-tert-butoxyphenyl)ethane

The following were charged to a four-neck flask equipped with a stirrer, reflux condenser, addition funnel, and thermometer: 176.3 g (1 mol) p-tert-butoxystyrene, 0.2 g 4-methoxyphenol, and sufficient 2 weight % isopropanolic chloroplatinic acid solution to give approximately 100 ppm as platinum. While stirring and heating at 50 to 60 degrees Centigrade, 104 g (1.1 mol) dimethylchlorosilane was dripped in over 5 hours from the addition funnel. After completion of the reaction, distillation in vacuo afforded 203 g (0.75 mol) of the target material. The yield was 75%. The properties of this product are reported below.

boiling point: 110 degrees Centigrade/0.3 mmHg.

NMR delta (ppm): 0.15 (s, 6H), 0.93 to 1.43 (m, 2H), 1.27 (s, 9H), 2.25 to 2.83 (m, 2H), 6.7 to 7.3 (m, 4H).

EXAMPLE 3

The following were charged to a four-neck flask equipped with a stirrer, reflux condenser, addition funnel, and thermometer: 95 g (0.35 mol) of the 1-(chlorodimethylsilyl)-2-(p-tert-butoxyphenyl)ethane as prepared in Reference Example 3, 104.2 g (0.5 mol) tetraethoxysilane, and 50 g toluene. While stirring and heating at 70 degrees Centigrade, a mixture of 30 g water and 30 g hydrochloric acid was dripped in over approximately 2 hours. Heating under reflux at approximately 75 degrees Centigrade was continued for an additional 4 hours after the completion of addition. 100 g water was then added, and the reaction mixture separated into two layers upon standing. The lower layer (polymer layer) was taken off, 100 g toluene was added to it, and this mixture was placed in a flask equipped with a graduated water separator. The water and ethanol were azeotropically removed, 0.10 g potassium hydroxide was added, and dehydration was continued for 4 hours and the residual silanol was condensed. Cooling to room temperature, neutralization by the addition of trimethylchlorosilane, filtration, and concentration afforded 82 g of an organopolysiloxane of the present invention. The yield was 86%. This product was soluble in methanol, tetrahydrofuran, dimethylformamide, and methyl isobutyl ketone, but poorly soluble in hexane, carbon tetrachloride, toluene, etc. It was soluble in aqueous sodium hydroxide and aqueous tetramethylammonium hydroxide. The properties of this product are reported below.

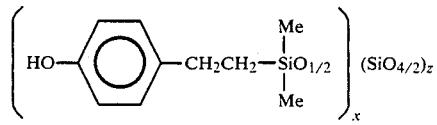

in the formula, x:z=0.7:1.
softening point: 90 to 100 degrees Centigrade.
molecular weights:
$\overline{M}_w = 2.0 \times 10^3$
$\overline{M}_n = 1.7 \times 10^3$ $^1$HNMR delta (ppm): −0.5 to 0.5 (br, 6H), 0.5 to 1.3 (br, 2H), 2.3 to 3.0 (br, 2H), 6.5 to 7.4 (br, 4H).

$^{29}$SiNMR delta (ppm): −115 to −105 (br, 0.87Si), −105 to −95 (br, 0.13Si), 10 to 20 (br, 0.75Si).

REFERENCE EXAMPLE 4

Synthesis of p-methoxyphenyldimethylchlorosilane

The following were placed in a dry four-neck flask equipped with a stirrer, reflux condenser, addition funnel, and thermometer under a nitrogen blanket: 23.3 g (1.0 mol) powdered magnesium, 129.1 g (1.0 mol) dimethyldichlorosilane, and 200 mL tetrahydrofuran. A small quantity of iodine was added in order to activate the magnesium. Then, while cooling the flask to below 10 degrees Centigrade, a mixture of 142.6 g (1.0 mol) p-chloroanisole and 300 mL tetrahydrofuran was dripped in from the addition funnel with stirring over 5 hours. The reaction mixture was aged by heating under reflux for 2 hours, the precipitate was removed by suction filtration, and the filtrate was distilled to give 122 g (0.61 mol) product. The yield was 61%. The properties of this product are reported below.

boiling point: 100 to 104 degrees Centigrade/3 mmHg.

NMR delta (ppm): 0.70 (s, 6H), 3.75 (s, 3H), 6.8 to 7.5 (m, 4H).

EXAMPLE 4

The following were placed in a four-neck flask equipped with a stirrer, reflux condenser, addition funnel, and thermometer: 70.3 g (0.35 mol) of the p-methoxyphenyldimethylchlorosilane as prepared in Reference Example 4, 104.2 g (0.5 mol) tetraethoxysilane, and 50 g toluene. Hydrolysis, layer separation, dehydration, and condensation as in Example 3 afforded 80 g of a polymer containing methyl-protected phenol. The yield was 88%. In order to remove the protective group, the obtained polymer was dissolved in chloroform in a flask under nitrogen, iodotrimethylsilane was added at 1.5 equivalents based on the methoxy group, and the reaction was stirred for 3 hours at room temperature. Methanol was then added, followed by stirring for an additional 2 hours. This was followed by successively washing with aqueous sodium bisulfite, aqueous sodium bicarbonate, and ion-exchanged water, drying, filtration, and concentration, thus to yield up an organopolysiloxane of the present invention. The properties of this product, as reported below, confirmed it to be an organopolysiloxane with the following structure.

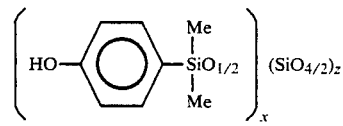

in the formula, x:z=0.7:1.
softening point: 95 to 105 degrees Centigrade.
molecular weights:
$\overline{M}_w = 2.0 \times 10^3$
$\overline{M}_n = 1.7 \times 10^3$ $^1$HNMR delta (ppm): 0.4 to 1.0 (br, 6H), 6.7 to 7.5 (br, 4H)

$^{29}$SiNMR delta (ppm): −115 to −105 (br, 0.85Si), −105 to −95 (br, 0.15Si), −10 to 5 (br, 0.72Si)

Effects of the Invention

The present invention provides a novel alkali-soluble organopolysiloxane having within each molecule both an hydroxyphenyl group-containing monofunctional triorganosiloxane unit and the tetrafunctional siloxane unit.

That which is claimed is:

1. Alkali-soluble organopolysiloxane with a molecular weight of 500 to 500,000 and having the following general formula

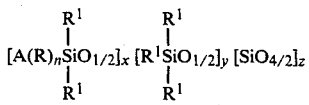

in the formula, A is a hydroxyphenyl group; R is an alkylene group having 1 to 4 carbon atoms; n is zero or one; $R^1$ is an alkyl group having 1 to 4 carbon atoms; x and z are positive numbers; y is zero or a positive number; x, y, and z have values such that their ratios are $0.3 \leq (x+y)/z \leq 4$; and zero $\leq y/x \leq 5$.

2. The alkali-soluble organopolysiloxane as described in claim 1 which is solid at room temperature and the ratios of x, y, and z are $0.4 \leq (x+y)/z \leq 1.2$ and zero $\leq y/x \leq 5$.

3. The alkali-soluble organopolysiloxane as described in claim 1 which has the following formula

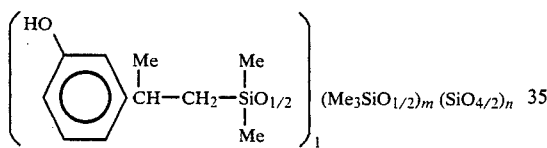

in which 1:m:n=0.4:0.4:1, the organopolysiloxane has an $\overline{M}_n$ of $1.1 \times 10^3$; and $\overline{M}_w$ of $1.3 \times 10^3$; a softening point of 80° to 85° C.; $^1$HNMR delta (ppm) values of −0.4 to 0.4 (br, 15H), 0.7 to 1.4 (br, 6H), 2.5 to 3.1 (br, 6H), 6.2 to 7.2 (br, 4H); $^{29}$SiNMR delta (ppm) values of −115 to −103 (br, 0.93Si), −103 to −98 (br, 0.07Si), 9 to 16 (br, 0.63Si); $^{13}$CNMR delta (ppm) values of 1 (s, 4.5C), 25 (s, 1C), 28 (s, 1C), 36 (s, 1C)114 (s, 1C), 119 (m, 2C), 129 (s, 1C), 149 to 157 (m, 2C); and IR (cm$^{-1}$) values of 3450 (br), 2970, 2900, 1600, 1490, 1450, 1250, 1080 (br), 840, 760, 700.

4. The alkali-soluble organopolysiloxane as described in claim 1 which has the formula

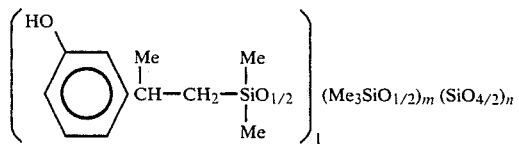

in which the ratio of 1:m:n is 0.35:0.35:1, an $\overline{M}_w$ of 3,400, and a softening point is 190°-200° C.

5. The alkali-soluble organopolysiloxane as described in claim 1 which has the formula

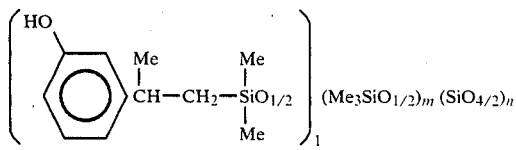

in which the ratio of 1:m:n is 0.35:0.5:1, an $\overline{M}_w$ of 1,200, and a softening point is 75°-80° C.

6. The alkali-soluble organopolysiloxane as described in claim 1 which has the formula

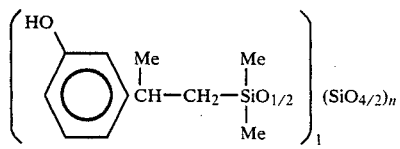

in which the ratio of 1: n is 0.5:1, the organopolysiloxane has a softening point of 150° to 160° C.; $^1$HNMR delta (ppm) values of −1.0 to 0.0 (br, 6H), 0.0 to 1.2 (br, 5H), 2.0 to 2.9 (br, 1H), 5.9 to 6.8 (br, 4H); $^{29}$SiNMR delta (ppm) values of −115 to −105 (br, 0.90Si), −105 to −95 (br, 0.10Si), 10 to 20 (br, 0.59Si); an $\overline{M}_w = 5.6 \times 10^3$; and an $\overline{M}_n = 3.2 \times 10^3$.

7. The alkali-soluble organopolysiloxane as described in claim 1 which has the following formula

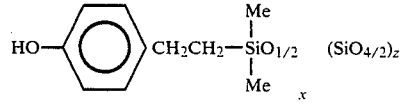

in which the ratio of x:z is 0.7:1, the organopolysiloxane has a softening point of 90° to 100° C.; an $\overline{M}_w$ of $2.0 \times 10^3$; an $\overline{M}_n$ of $1.7 \times 10^3$; $^1$HNMR delta (ppm) values of −0.5 to 0.5 (br, 6H), 0.5 to 1.3 (br, 2H), 2.3 to 3.0 (br, 2H), 6.5 to 7.4 (br, 4H); and $^{29}$SiNMR delta (ppm) values of −115 to −105 (br, 0.87Si), −105 to −95 (br, 0.13Si), 10 to 20 (br, 0.75Si).

8. The alkali-soluble organopolysiloxane as described in claim 1 which has the following formula

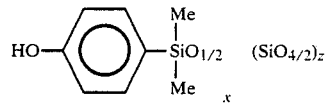

in which the ratio of x:z is 0.7:1, the organopolysiloxane has a softening point of 95° to 105° C.; an $\overline{M}_w$ of $2.0 \times 10^3$; an $\overline{M}_n$ of $1.7 \times 10^3$; $^1$HNMR delta (ppm) values of 0.4 to 1.0 (br, 6H), 6.7 to 7.5 (br, 4H); and $^{29}$SiNMR delta (ppm): value of −115 to −105 (br, 0.85Si), −105 to −95 (br, 0.15Si), −10 to 5 (br, 0.72Si).

* * * * *